(12) United States Patent
Fukuhara et al.

(10) Patent No.: US 7,139,998 B2
(45) Date of Patent: Nov. 21, 2006

(54) PHOTOMASK DESIGNING METHOD, PATTERN PREDICTING METHOD AND COMPUTER PROGRAM PRODUCT

(75) Inventors: Kazuya Fukuhara, Tokyo (JP); Tatsuhiko Higashiki, Fujisawa (JP); Soichi Inoue, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 431 days.

(21) Appl. No.: 10/673,427

(22) Filed: Sep. 30, 2003

(65) Prior Publication Data
US 2004/0133872 A1 Jul. 8, 2004

(30) Foreign Application Priority Data
Sep. 30, 2002 (JP) ............................. 2002-287363

(51) Int. Cl.
*G06F 17/50* (2006.01)
(52) U.S. Cl. .......................................... 716/21; 716/19
(58) Field of Classification Search ................... 716/19, 716/21
See application file for complete search history.

(56) References Cited

U.S. PATENT DOCUMENTS

| | | | | |
|---|---|---|---|---|
| 6,114,071 | A * | 9/2000 | Chen et al. ..................... 430/5 |
| 6,374,396 | B1 * | 4/2002 | Baggenstoss et al. ......... 716/19 |
| 6,470,489 | B1 * | 10/2002 | Chang et al. .................. 716/21 |
| 6,721,940 | B1 * | 4/2004 | Miwa et al. ................... 716/21 |
| 6,741,327 | B1 * | 5/2004 | Nomura et al. ............... 355/52 |
| 2003/0088847 | A1 * | 5/2003 | Chang et al. .................. 716/19 |

FOREIGN PATENT DOCUMENTS

| | | |
|---|---|---|
| JP | 9-63943 | 3/1997 |
| JP | 11-184064 | 7/1999 |
| JP | 2001-183811 | 7/2001 |
| JP | 2001-230179 | 8/2001 |

OTHER PUBLICATIONS

Sato, K. et al., "Method For Inspecting Exposure Apparatus", U.S. Appl. No. 09/783,295, filed Feb. 15, 2001.
Sato, K. et al., "Measuring Method of Illuminance Uneveness of Exposure Apparatus, Correcting Method of Illuminance Uneveness, Manufacturing Method of Semiconductor Device, and Exposure Apparatus", U.S. Appl. No. 10/131,083, filed Apr. 25, 2002.
Notification of Reasons for Rejection in First Examination issued by the Taiwanese Patent Office in counterpart Taiwanese application, and English translation of Notice Dec. 22, 2004.

* cited by examiner

*Primary Examiner*—Jack Chiang
*Assistant Examiner*—Brandon W. Bowers
(74) *Attorney, Agent, or Firm*—Finnegan, Henderson, Farabow, Garrett & Dunner, L.L.P.

(57) ABSTRACT

A photomask designing method used in a lithography process, the lithography process comprises illuminating light on a photomask and converging the light which has passed through the photomask on a photosensitive substrate via a projection optical system, the photomask designing method comprises acquiring a transmittance characteristic of the projection optical system, the characteristic varing depending on a difference in optical paths of light in the projection optical system, the light passing through the projection optical system, and acquiring mask bias of the photomask by use of the transmittance characteristic of the projection optical system.

20 Claims, 9 Drawing Sheets

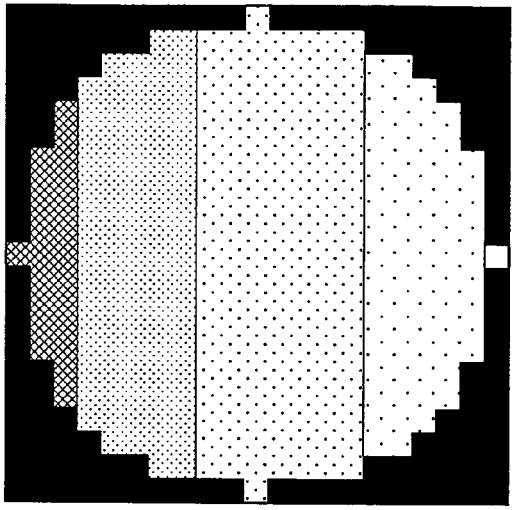
F I G. 12
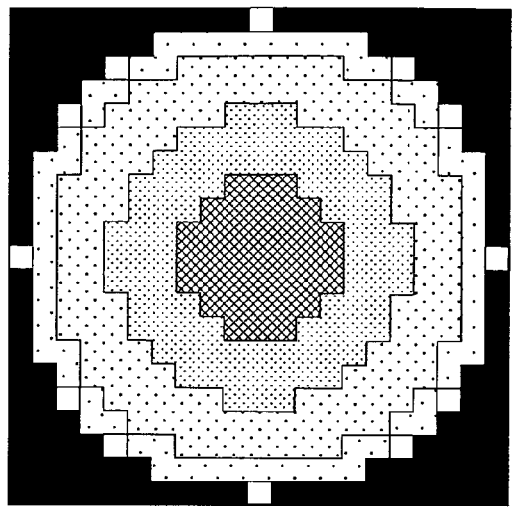
F I G. 13
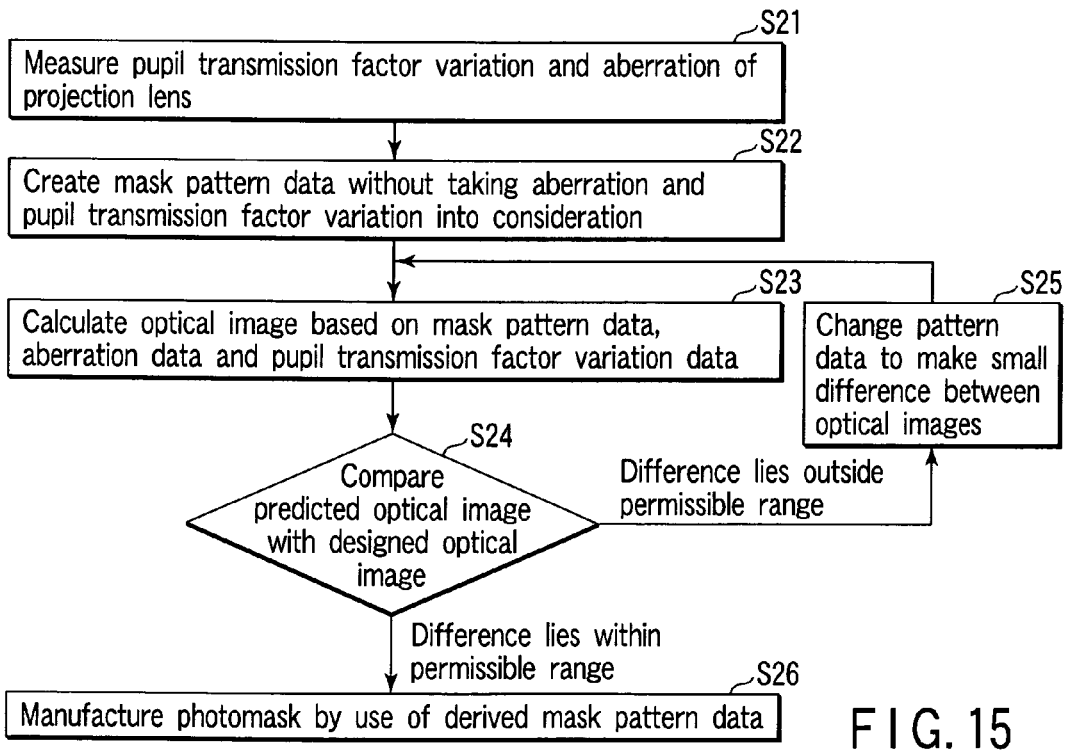
F I G. 15
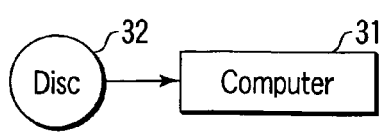
F I G. 16

PHOTOMASK DESIGNING METHOD, PATTERN PREDICTING METHOD AND COMPUTER PROGRAM PRODUCT

CROSS-REFERENCE TO RELATED APPLICATIONS

This application is based upon and claims the benefit of priority from the prior Japanese Patent Application No. 2002-287363, filed Sep. 30, 2002, the entire contents of which are incorporated herein by reference.

BACKGROUND OF THE INVENTION

1. Field of the Invention

The present invention relates to a designing method of a photomask used in a lithography process for a semiconductor device, a method for predicting a pattern formed in the lithography process and a computer program product.

2. Description of the Related Art

In the photolithography step which is one of the manufacturing steps of a semiconductor device, an exposure device is used. Exposure light, for example, ArF excimer laser light, is illuminated on the photomask by use of the exposure device and an image of a mask pattern is reduced and projected onto the surface of a substrate which is coated with photosensitive resin (photoresist).

The exposure light illuminated on the photomask is diffracted by the mask pattern. The diffracted light passes through a projecting lens and is converged on the substrate. Then, an interference pattern which is called an optical image is formed near the surface of the substrate. The photoresist is exposed to light along the interference pattern.

A fine pattern is formed on the surface of the substrate by subjecting the exposed substrate to a developing process. The fine pattern forming technique is improved year by year. In recent years, a resist pattern with a dimension smaller than 130 nm can be formed.

In order to form the fine resist pattern, it is important to control the exposure light amount (exposure dose). The photoresist can be properly exposed to light by exposing light of proper light intensity and, as a result, a resist pattern of a desired dimension can be formed on the substrate.

A resist pattern of a desired dimension cannot be formed if the exposure light amount is excessively larger or smaller. If the resist pattern of the desired dimension is not formed, a semiconductor device manufactured via steps performed after the photolithography process is not correctly operated. As a result, the semiconductor device is treated as a faulty device.

Therefore, in the manufacturing process, the dimension of the resist pattern is measured by use of, for example, an electron microscope after the exposure step. If the dimension is not a desired value, the photoresist is removed and then the process is started again from the beginning of the photolithography step.

An area which is simultaneously exposed by use of the exposure device is a rectangular form having one side of several tens of mm. One or more semiconductor devices are formed in the above area (simultaneously exposed area). Therefore, it is necessary to set the dimension of the resist pattern to a desired value in the entire portion of the simultaneously exposed area.

Generally, various patterns such as densely crowded patterns and isolated patterns are contained in patterns which can be transferred by one exposure process. When patterns with a dimension which is equivalent to or smaller than the exposure light wavelength are formed, not all of the patterns can be formed with desired dimensions even if the shape of the mask pattern is made similar to the shape of the resist pattern to be formed. That is, even if the dimension of the mask pattern is set to a dimension calculated by dividing the dimension of the resist pattern by the reduction rate of the projecting lens, not all of the patterns can be formed with the desired dimension.

Therefore, for example, in order to form or finish the densely crowded patterns and isolated patterns to have the same resist dimension, the mask pattern designing dimension corresponding to the densely crowded patterns and the mask pattern designing dimension corresponding to the isolated patterns are respectively changed to mask pattern designing dimensions of values different from dimensions calculated by dividing the dimensions of the resist patterns by the reduction rate of the projecting lens. The amount of a change of the mask pattern designing dimension is called the mask bias. The resist finishing dimension can be adjusted by changing the mask bias according to the pattern types.

In the actual exposure device, a phenomenon wherein the amplitude of light is attenuated by different amounts depending on the paths through which the light passes (which is hereinafter referred to as a pupil transmission factor variation) occurs. This is caused by non-uniformity of an anti-reflection film of a lens configuring the projection optical system or a lowering in the transmission factor due to the thickness of the lens as is described in Jpn. Pat. Appln. KOKAI Publication No. H9-63943, for example.

If the paths for diffraction light in the projection optical system are different, generally, the angle of the diffraction light incident on the projection lens and the distance through which the diffraction light passes through the projection lens will be changed. Therefore, the transmission factor of the projection optical system is changed depending on the paths for the diffraction light. Particularly, in fused silica which is generally used as a lens material at present, the transparency thereof tends to become lower for light with the wavelength shorter than 200 nm as the wavelength becomes shorter. Therefore, the pupil transmission factor variation indicates a particularly large value in the ArF exposure device (the exposure light wavelength is 193 nm).

The paths through which diffraction lights pass are different depending on the mask patterns. Therefore, when the pupil transmission factor variation occurs in the projection lens, the transmission factor of the projection optical system receives different influences depending on the mask patterns. As a result, the optimum exposure light amount set to finish the resist pattern to a desired dimension is changed. In addition, the degree of the change becomes different depending on the pattern types, for example, between the densely crowded patterns and the isolated patterns.

Therefore, even when the mask biases of the respective patterns are designed to simultaneously finish the densely crowded patterns and the isolated patterns to desired dimensions, there occurs a possibility that the densely crowded patterns and the isolated patterns may not be simultaneously finished to the desired dimensions if the pupil transmission factor variation is not taken into consideration.

In order to prevent occurrence of the above problem in advance, a method for preparing in advance a plurality of photomasks having different mask biases and deriving optimum mask bias based on trial and error is considered. However, a relatively long time and high cost are required to realize the above method and the method cannot be used as a practical solution.

Further, in order to prevent an influence by the pupil transmission factor variation, a method for measuring the degree of a pupil variation rate of the projection optical system, predicting an optical image on a photosensitive substrate based on the result of measurement and designing a photomask to make the predicted optical image and the designed optical image coincident to each other is considered.

The measuring method of the degree of the pupil transmission variation rate is disclosed in Jpn. Pat. Appln. KOKAI Publication No. 2001-230179, for example. By carrying out the measuring method, the distribution of transmission factors in a plurality of points on a pupil coordinate system can be understood.

In the conventional measuring method, data of the pupil transmission factor variation is matrix data on a pupil plane. Therefore, when the pupil transmission factor variation varies in a complicated fashion on the pupil plane, the data amount which is required to be processed becomes extremely large. Therefore, an optical image predicting method carried out based on the measurement result of the conventional measuring method and the photomask designing method using the optical image predicting method cannot be used as practical methods.

BRIEF SUMMARY OF THE INVENTION

According to an aspect of the present invention, there is provided a photomask designing method used in a lithography process, the lithography process comprising illuminating light on a photomask and converging the light which has passed through the photomask on a photosensitive substrate via a projection optical system, the photomask designing method comprising: acquiring a transmittance characteristic of the projection optical system, the characteristic varing depending on a difference in optical paths of light in the projection optical system, the light passing through the projection optical system, and acquiring mask bias of the photomask by use of the transmittance characteristic of the projection optical system.

According to another aspect of the present invention, there is provided a pattern predicting method for predicting a pattern to be formed on a photosensitive substrate, the pattern being formed by illuminating light on a photomask and converging the light which has passed through the photomask on the photosensitive substrate via a projection optical system, the pattern predicting method comprising: approximating a transmission factor variation of the projection optical system by use of an orthogonal polynomial defined by pupil coordinates of the projection optical system, the transmission factor varing depending on a difference in optical paths of light in the projection optical system, the light passing through the projection optical system, and predicting the pattern based on expansion coefficients of the orthogonal polynomial, the expansion coefficients approximating the transmission factor variation of the projection optical system.

According to another aspect of the present invention, there is provided a photomask designing method used in a lithography process, the lithography process comprising illuminating light on a photomask and converging the light which passes through the photomask on a photosensitive substrate via a projection optical system, the photomask designing method comprising: approximating a transmission factor variation of the projection optical system by use of an orthogonal polynomial defined by pupil coordinates of the projection optical system, the transmission factor varing depending on a difference in optical paths of light in the projection optical system, the light passing through the projection optical system, predicting a pattern formed by converging the light having passed through the photomask on the photosensitive substrate via the projection optical system based on expansion coefficients of the orthogonal polynomial, the expansion coefficients approximating the transmission factor variation of the projection optical system, determining whether a difference between the predicted pattern and a designed pattern corresponding to the photomask lies within a predetermined range or not, and correcting the photomask to set the difference between the predicted pattern and the designed pattern into the predetermined range when the difference does not lie within the preset range.

According to another aspect of the present invention, there is provided a computer program product configured to store program instructions for execution on a computer system enabling the computer system to perform a process for predicting a pattern to be formed on a photosensitive substrate, the pattern being formed by illuminating light on a photomask and converging the light which has passed through the photomask on the photosensitive substrate via a projection optical system, wherein the predicting the pattern comprising: approximating a transmission factor variation of the projection optical system by use of an orthogonal polynomial defined by pupil coordinates of the projection optical system, the transmission factor variation varing depending on a difference in optical paths of light in the projection optical system, the light passing through the projection optical system; and predicting the pattern based on expansion coefficients of the orthogonal polynomial, the expansion coefficients approximating the transmission factor variation of the projection optical system.

According to another aspect of the present invention, there is provided a computer program product configured to store program instructions for execution on a computer system enabling the computer system to perform a process for designing a photomask used for a lithography process, the lithography process including illuminating light on the photomask and converging the light having passed through the photomask via the projection optical system, wherein the designing the photomask comprising: approximating a transmission factor variation of the projection optical system by pupil coordinates of the projection optical system, the transmission factor varing depending on a difference in optical paths of light in the projection optical system, the light passing through the projection optical system, predicting a pattern formed by converging the light having passed through the photomask on the photosensitive substrate via the projection optical system based on expansion coefficients of the orthogonal polynomial, the expansion coefficients approximating the transmission factor variation of the projection optical system, determining whether a difference between the predicted pattern and a designed pattern corresponding to the photomask lies within a predetermined range or not, and correcting the photomask to set the difference between the predicted pattern and the designed pattern into the predetermined range when the difference does not lie within the preset range.

BRIEF DESCRIPTION OF THE SEVERAL VIEWS OF THE DRAWING

FIG. 12 is a diagram showing one example of a pupil transmittance variation distribution corresponding to a second term of a Zernike series expansion;

FIG. 13 is a diagram showing one example of a pupil transmittance variation distribution corresponding to a fourth term of the Zernike series expansion;

FIG. 15 is a flowchart for illustrating a mask pattern forming method according to a fifth embodiment of the present invention; and FIG. 16 is a diagram showing another embodiment of the present invention.

DETAILED DESCRIPTION OF THE INVENTION

There will now be described embodiments of the present invention with reference to the accompanying drawings.

(First Embodiment)

Figure 1:
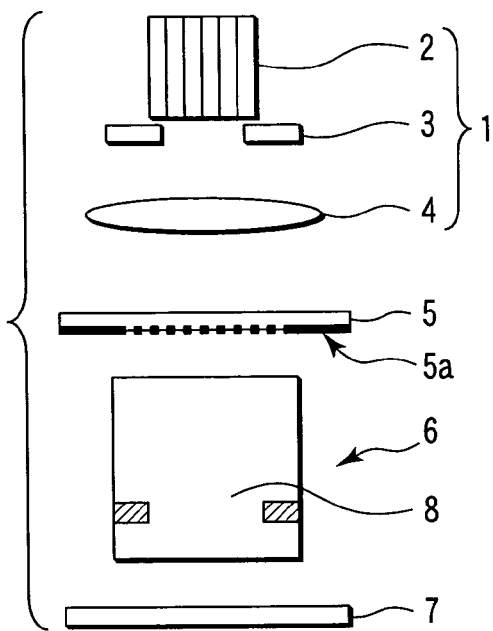
FIG. 1 is a schematic configuration view showing one example of a reduction type projection exposure device.

FIG. 1 is a schematic configuration view showing one example of a reduction type projection exposure device. In FIG. 1, a reference symbol 1 denotes an optical system for illumination, and reference symbols 2 to 4 respectively denote a fly's eye lens, illumination aperture (secondary light source plane) and condenser lens which configure the illumination optical system 1.

Generally, illumination light emitted from the illumination optical system 1 is light whose wavelength lies within a range of 157 nm to 365 nm. The illumination light illuminates a square pattern area having one side of 10 cm on a photomask 5 with substantially constant illuminance.

In the pattern area of the photomask 5, for example, a pattern having repetitiveness in one direction (linear pattern), an isolated pattern isolated from the surrounding patterns and a pattern having repetitiveness in two directions such as vertical direction, lateral direction or oblique direction (two-dimensional pattern) is arranged. The above pattern is configured by transparent regions and light shielding regions. In this case, it is possible to use semi-transparent regions instead of the light shielding regions (attenuated phase shift).

Light incident on the photomask 5 is diffracted by the above pattern (pattern surface 5a) and is then made incident on a projection optical system 6. The projection optical system 6 converges the incident light. An image of the photomask 5 is formed on a photosensitive substrate (wafer) 7 by the light converged by the projection optical system 6.

If the reduction rate of the projection optical system 6 is M and when a pattern area illuminated on the photomask 5 is a square having each side of X [mm], for example, a simultaneously illuminated area on the photosensitive substrate 7 becomes a square having each side of M·X [mm]. An exposure device having the reduction rate M of ¼ or ⅕ is generally used.

A diaphragm (diaphragm opening) which defines the effective size (diameter) of the projection optical system 6 lies in the internal portion of the projection optical system 6. A plane 8 on which the diaphragm opening lies is called a pupil or pupil plane.

Figure 2:
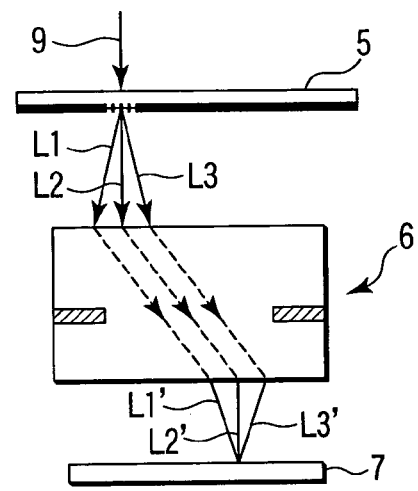
FIG. 2 is a view schematically showing a state in which three diffraction lights emitted on a photomask pass through different points on a pupil plane and reach one image point on a photosensitive substrate.

FIG. 2 is a view schematically showing a state in which illumination light 9 is made incident on the photomask 5, three diffraction lights emitted on the photomask 5 pass through different points on the pupil plane and reach one image point on the photosensitive substrate 7.

In FIG. 2, L1 to L3 indicate diffraction lights which pass through the photomask 5 and are not yet made incident on the projection optical system 6 and L1' to L3' indicate diffraction lights which have passed through the photomask 5 and have further passed through the projection optical system 6.

When a pupil transmission factor (transmittance) variation occurs in the projection optical system 6, the diffraction lights are attenuated by different amounts for the respective optical paths. As a result, the exposure light amount characteristic relating to the pattern transfer is different from that of a case wherein no pupil transmission factor variation occurs.

Figure 3A:
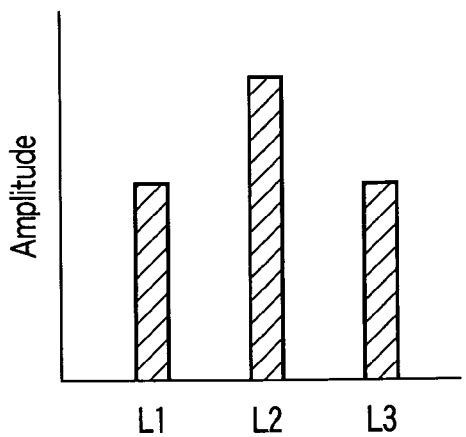
FIGS. 3A and 3B are diagrams showing the amplitudes of diffraction lights before they are incident on the projection optical system and after they pass through the projection optical system when a pupil transmission factor variation occurs.
Figure 3B:
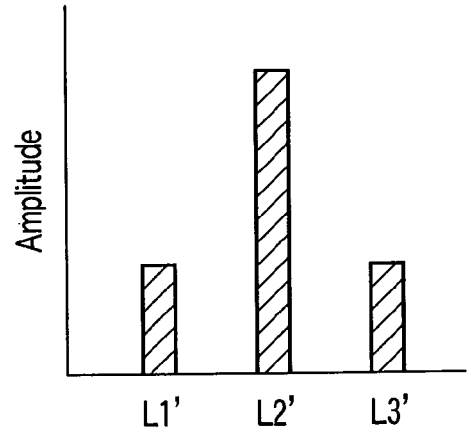

FIGS. 3A and 3B show the amplitudes of the diffraction lights L1 to L3 before they are made incident on the projection optical system 6 (FIG. 3A) and the amplitudes of the diffraction lights L1' to L3' after they have passed through the projection optical system 6 (FIG. 3B) when the transmission factor is different in the central portion and peripheral portion of the projection optical system 6.

The transmission factor is different in the central portion and peripheral portion of the projection optical system 6. Therefore, the amplitudes of the diffraction lights L1' to L3' are attenuated after they have passed through the projection optical system 6. As a result, the amplitude ratios (light intensity ratios) of the diffraction lights L1' and L3' to the diffraction light L2' are different from the amplitude ratios of the diffraction lights L1 and L3 to the diffraction light L2.

For example, it is considered that the ratio of the widths of the transparent region and the light shielding region in the photomask 5 is set to 1:1 under an illumination condition in which the illumination aperture 3 is small (approximately 0.3). That is, it is considered that a line-and-space pattern (which is hereinafter referred to as a first L&S pattern) having a duty ratio of 0.5 and a line-and-space pattern (which is hereinafter referred to as a second L&S pattern) having a duty ratio of 0.5 and a repetitive interval shorter than that of the first L&S pattern are simultaneously reduced and projected onto two neighboring regions on the photosensitive substrate 7.

Figure 4A:
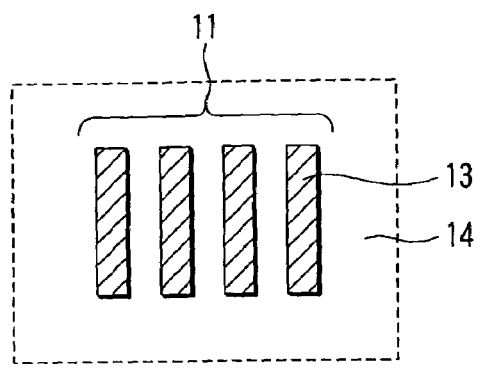
FIGS. 4A and 4B are views schematically showing a first line-and-space (L&S) pattern and optical paths of diffraction lights associated with the image forming process.
Figure 4B:
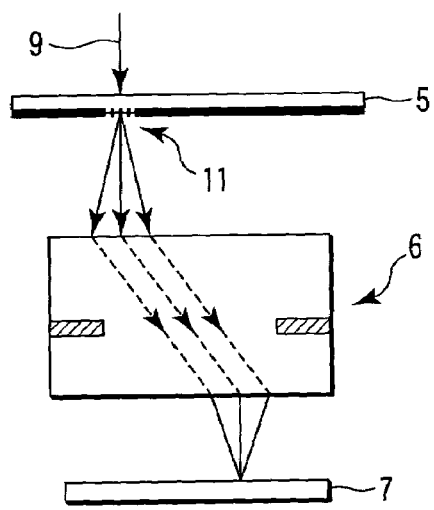

FIGS. 4A and 4B are views schematically showing the first L&S pattern and optical paths of diffraction lights associated with the image forming process thereof. As shown in FIGS. 4A and 4B, a first L&S pattern 11 is configured by light shielding regions 13 and transparent regions 14.

Among the diffraction lights generated by the first L&S pattern 11, zero-order diffraction light and first-order diffraction light are mainly used to form an image. The amplitude ratio of the zero-order diffraction light and first-order diffraction light depends on the duty ratio. The ratio of the amplitude C0 of the zero-order diffraction light to the amplitude C1 of the first-order diffraction light is expressed by using the duty ratio β as follows.

C0:C1=1: sin (πβ)/(πβ)

For example, C0:C1=1:0.64 can be attained when the duty ratio is 0.5.

Next, a pupil transmission factor variation of the projection optical system 6 is measured. In order to measure the pupil transmission factor variation, for example, a method disclosed in the first embodiment (paragraph numbers 0034 to 0049, FIGS. 1 to 4) of Jpn. Pat. Appln. KOKAI Publication No. 2001-230179, which is an invention by the chief inventor of the present application, is used as the known measurement method.

In the above method, the transmission factor of the projection optical system 6 is derived for diffraction lights generated on the photomask 5 and passing through the projection optical system 6. Further, it becomes unnecessary to derive the transmission factor of the projection optical system 6 for each photomask 5 to be used if the transmission factors of the projection optical system are derived for a large number of optical paths in the projection optical system 6 for light passing through the projection optical system 6.

Figure 5A:
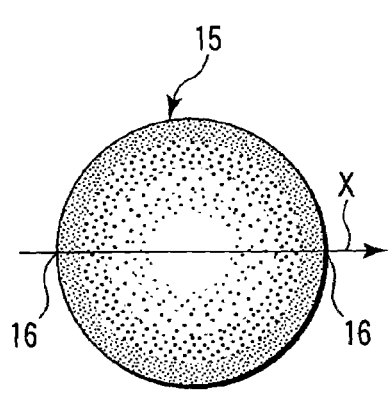
FIGS. 5A and 5B are a view and diagram for illustrating a pupil transmittance variation characteristic.
Figure 5B:
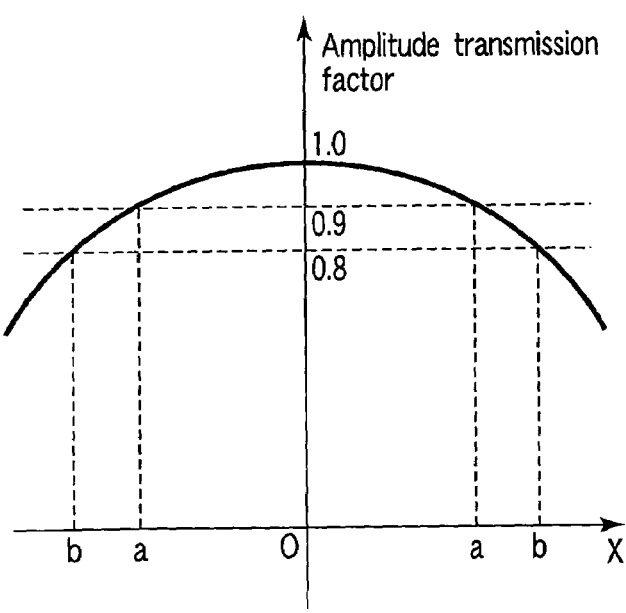

In the following explanation, it is assumed that the pupil transmission factor variation occurs so that the central portion of a pupil 15 of the projection optical system 6 will be most transparent and the amplitude transmission factor may become lower in portions nearer to the ends of the pupil 15 as shown in FIGS. 5A and 5B as the measurement result of the pupil transmission factor variation.

The amplitude ratio (C0:C1) of the zero-order diffraction light to the first-order diffraction light becomes equal to 1:0.64 before the diffraction lights are made incident on the projection optical system 6. The transmission factor of the optical path of the zero-order diffraction light caused by the first L&S pattern 11 is 1 (X=0).

In this case, if the amplitude transmission factor of the optical path of the first-order diffraction light caused by the first L&S pattern 11 is 0.9 (X=b), the amplitude ratio (C0:C1) changes to 1:0.58 immediately before the diffraction light which has passed through the projection optical system 6 reaches the photosensitive substrate 7.

As a result, the state of an image is changed in comparison with a case wherein no pupil transmission factor variation occurs and the optimum exposure light amount used to form a pattern with a desired dimension is changed.

Figure 6A:
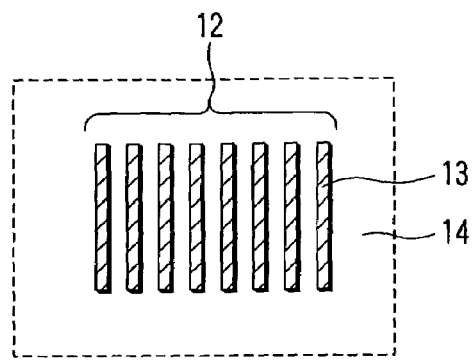
FIGS. 6A and 6B are views schematically showing a second L&S pattern and optical paths of diffraction lights associated with the image forming process.
Figure 6B:
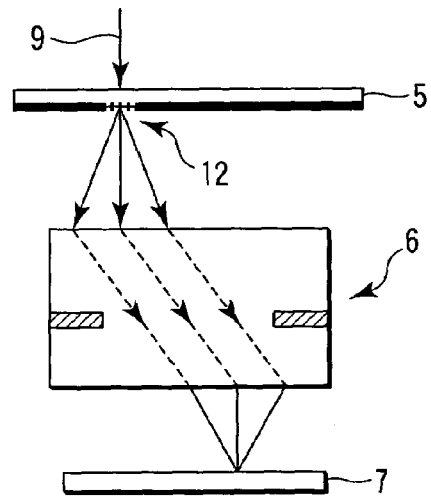

FIGS. 6A and 6B are views schematically showing a second L&S pattern and optical paths of light associated with the image forming process. The path of the first-order diffraction light of the second L&S pattern 12 is different from the path of the first-order diffraction light of the first L&S pattern 11.

The amplitude ratio (C0:C1) of the zero-order diffraction light to the first-order diffraction light becomes equal to 1:0.64 before the diffraction lights are made incident on the projection optical system 6. The transmission factor of the optical path of the zero-order diffraction light generated by the second L&S pattern 12 is 1 (X=0).

In this case, if the amplitude transmission factor of the optical path of the first-order diffraction light caused by the second L&S pattern 12 is 0.8 (X=a), the amplitude ratio (C0:C1) of the diffraction lights changes to 1:0.51 immediately before the diffraction light which has passed through the projection optical system 6 reaches the photosensitive substrate 7.

As a result, the state of an image is changed in comparison with a case wherein no pupil transmission factor variation occurs. More specifically, the optimum exposure light amount of the second L&S pattern 12 varies and the variation amount thereof is different from the variation amount of the first L&S pattern 11.

That is, in the above state, the second L&S pattern 12 becomes thin when the first L&S pattern 11 is formed with a desired dimension. Further, when the second L&S pattern 12 is formed with a desired dimension, the first L&S pattern 11 becomes thick. Therefore, the first and second L&S patterns 11 and 12 cannot be formed with desired dimensions at the same time.

In order to solve the above problem, in this embodiment, mask biases which are the duty ratios of the first and second L&S patterns 11 and 12 in this example are adjusted. For example, the duty ratios of the first and second L&S patterns 11 and 12 are adjusted so that the amplitude ratio (C0:C1) of the zero-order diffraction light to the first-order diffraction light after they passed through the projection optical system 6 will be set to 1:0.64.

That is, the amplitude ratio (C0:C1) of the zero-order diffraction light to the first-order diffraction light on the incident side may be set to 1:0.71 in the first L&S pattern 11 and 1:0.8 in the second L&S pattern 12. This can be attained by setting the duty ratio of the first L&S pattern 11 to 0.44 and setting the duty ratio of the second L&S pattern 12 to 0.36.

If the duty ratios are thus set, the amplitude ratio (C0:C1) of the zero-order diffraction light to the first-order diffraction light of the light which passed through the projection optical system 6 in the first and second L&S patterns 11 and 12 is set to 1:0.64. Therefore, it becomes possible to simultaneously form and finish a resist pattern (which is hereinafter referred to as a first L&S resist pattern) corresponding to the first L&S pattern 11 and a resist pattern (which is hereinafter referred to as a second L&S resist pattern) corresponding to the second L&S pattern 12 to desired dimensions on the photosensitive substrate 7.

As another method for finishing the first and second L&S resist patterns to the desired dimensions at the same time, a method in which the duty ratio of the second L&S pattern 12 is changed while the duty ratio of the first L&S pattern 11 is maintained at 0.5 can be used.

The amplitude ratio (C0:C1) of the zero-order diffraction light to the first-order diffraction light associated with image formation of the first L&S pattern 11 after they passed through the projection optical system 6 is set to 1:0.58. Further, the amplitude ratio of the diffraction lights associated with image formation of the second L&S pattern 12 is set to the same value. This can be attained by setting the duty ratio of the second L&S pattern 12 to 0.54.

If the duty ratios are thus set, the amplitude ratio (C0:C1) of the zero-order diffraction light to the first-order diffraction light of the light which passed through the projection optical system 6 in the first and second L&S patterns 11 and 12 is set to 1:0.58. Therefore, it becomes possible to simultaneously form and finish the first and second L&S patterns 11 and 12 to desired dimensions.

As described above, according to the present embodiment, the transmittance (transmission factor) characteristic of the projection optical system 6 is derived and the mask bias is derived by use of the transmittance characteristic. Therefore, an influence by the pupil transmission factor variation of the projection optical system 6 can be suppressed. Further, it becomes unnecessary to previously prepare photomasks having a plurality of different mask biases which cause an obstacle in the practical use and increase the cost, for example.

In the present embodiment, the duty ratio of the second L&S pattern 12 is changed while the duty ratio of the first L&S patterns 11 is kept fixed. However, it is also possible to change the duty ratio of the first L&S pattern 11 while the duty ratio of the second L&S patterns 12 is kept fixed. In this case, the duty ratio of the first L&S pattern 11 is so set that the amplitude ratio (C0:C1) of the zero-order diffraction light to the first-order diffraction light of the light which passed through the projection optical system 6 will be set to 1:0.51.

Further, in the present embodiment, a state in which two types of patterns are simultaneously finished to the desired dimensions is considered. However, even if three or more types of patterns are simultaneously finished to desired dimensions, all of the patterns can simultaneously be finished to the desired dimensions by use of the same method.

Application of the method of the present embodiment is not limited to the L&S pattern and the method can be applied to a pattern such as an isolated line, isolated space, whole pattern or a pattern having two-dimensional repetitiveness.

Further, application of the method of the present embodiment is not limited to the illumination condition in which the α value is set to approximately 0.3 and the method can be applied to any illumination condition.

However, when a pattern of a complicated shape is used or the illumination condition of large α value is set, complicated calculations are required to derive optimum mask bias. Therefore, in order to derive the optimum solution of the mask bias, a computer is used. In this case, instead of calculating the amplitude ratio of diffraction lights, the condition for the optimum mask bias may be derived by deriving the finished dimension of the resist pattern by computer simulation.

Further, even when the behavior of the pupil transmission factor variation is different from that of the present embodiment (FIGS. 5A, 5B), a resist pattern with an adequate dimension can be formed by, for example, deriving the optimum mask bias condition by computer simulation and reflecting the optimum mask bias condition on the mask bias design.

(Second Embodiment)

Next, the second embodiment is explained. In the following embodiments, the explanation is made on the assumption that the exposure device of FIG. 1 in the first embodiment is used. The same symbols as those in the drawings explained before denote the same or similar portions and the detail explanation thereof is omitted.

As described before, for the correct operation of a semiconductor device, it is necessary to suppress a variation in the dimensional of the resist pattern to a sufficiently small value in the simultaneously exposed area having one side of 20 to 35 mm (one side of 80 to 140 mm in terms of the dimension of the photomask 5) on the photosensitive substrate (wafer) 7.

In this case, since the pupil transmission factor variation occurs in the simultaneously exposed area, the pupil transmission factor variation causes a variation in the pattern dimension in the simultaneously exposed area. The reason why the pupil transmission factor variation occurs in the simultaneously exposed area can be considered as follows.

Figure 7A:
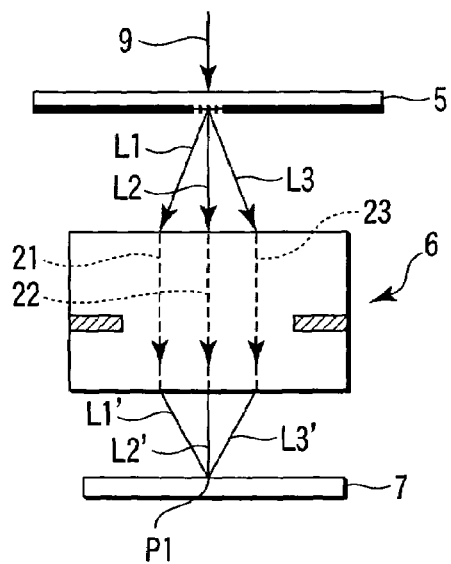
FIGS. 7A and 7B are views showing cases wherein optical paths in the projection optical system of diffraction light which reaches a portion near the center of a simultaneously exposed area and optical paths in the projection optical system of diffraction light which reaches a portion near the end of the simultaneously exposed area are different from each other.
Figure 7B:
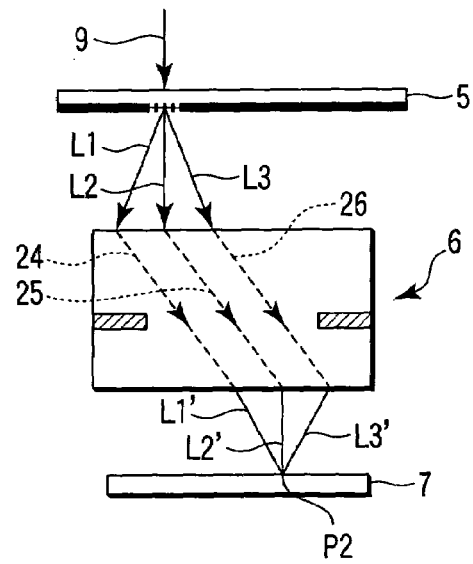

FIGS. 7A and 7B are show cases wherein optical paths 21 to 23 of first diffraction lights in the projection optical system 6 which reach a portion P1 near the center of the simultaneously exposed area and optical paths 24 to 26 of second diffraction lights in the projection optical system 6 which reach a portion P2 near the end of the simultaneously exposed area are different from each other.

The incident angles of the first and second diffraction lights with respect to the lens configuring the projection optical system 6 and the distances through which they pass in the internal portion of the lens material are different from each other. As a result, different pupil transmission factor variations are measured at the point P1 near the center of the simultaneously exposed area and at the point P2 near the end of the simultaneously exposed area.

Figure 8A:
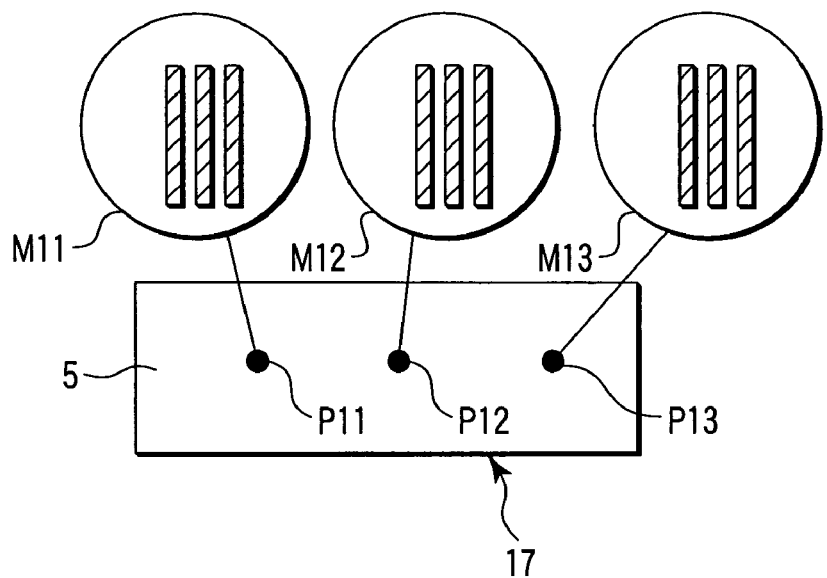
FIGS. 8A and 8B are a view and diagram showing a state in which the dimensions of a plurality of L&S patterns on the photosensitive substrate corresponding to a plurality of L&S patterns of the same dimension and shape in a simultaneously exposed area vary according to a pupil transmission factor variation.
Figure 8B:
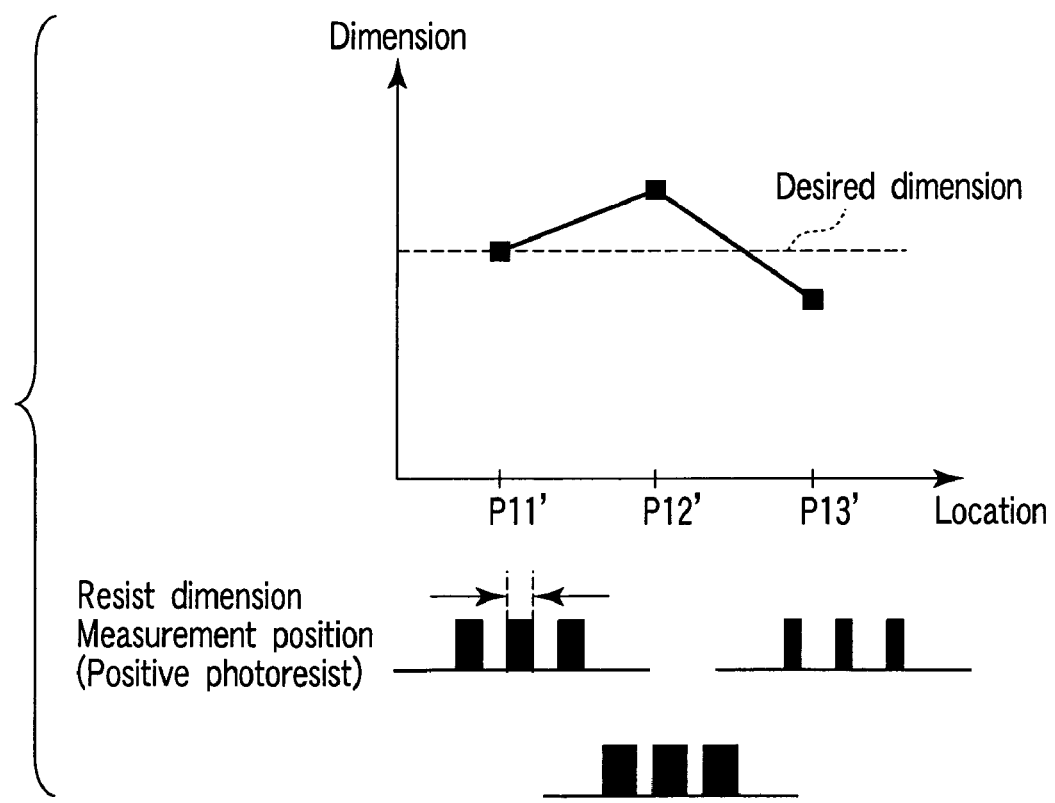

A method for suppressing a variation in the pattern dimension caused by occurrence of the pupil transmission factor variation in the simultaneously exposed area is explained. In this example, each of mask patterns M11 to M13 in fine regions P11 to P13 in the simultaneously exposed area of the photomask 5 is an L&S pattern of the same dimension and shape (FIG. 8A). Further, it is assumed that the dimension of the resist pattern varies between regions 11' to 13' on the photosensitive substrate corresponding to the regions 11 to 13 due to the pupil transmission factor variation (FIG. 8B).

First, the transmission factors of light in the projection optical system 6 which reach the regions 11 to 13 in the simultaneously exposed area are measured and the pupil transmission factor variation of the projection optical system 6 is derived. As the measurement method, the method described in Jpn. Pat. Appln. KOKAI Publication No. 2001-230179 which is the invention made by the head inventor of the present application, for example, is used as described in the first embodiment.

Next, the optimum value of mask bias is calculated for each of the regions 11 to 13 in the simultaneously exposed area by computer simulation by taking the pupil transmission factor variation into consideration.

In this case, the optimum value of mask bias for each of the regions in the simultaneously exposed area indicates the magnitude of mask bias which causes the patterns of the same shape lying in a plurality of different portions in the simultaneously exposed area to be finished to desired dimensions at the same time. Further, it indicates that mask bias of mask patterns used to form resist patterns of the same shape can be changed for respective regions of the simultaneously exposed area.

Some methods for determining the mask bias optimum value for each region can be considered. For example, a certain reference state is determined and mask bias of all of the patterns may be changed so as to set all of the patterns into the same state as the reference state. Alternatively, a certain region in the simultaneously exposed area is set as a reference state and mask bias may be determined to make the state of an image in another region coincident with the reference state.

Finally, the photomask 5 is designed and manufactured by use of the thus derived mask bias. It is confirmed that a variation in the dimension of a resist pattern formed by transferring the thus designed photomask 5 in the simultaneously exposed area is suppressed as shown in FIGS. 9A and 9B.

Figure 9A:
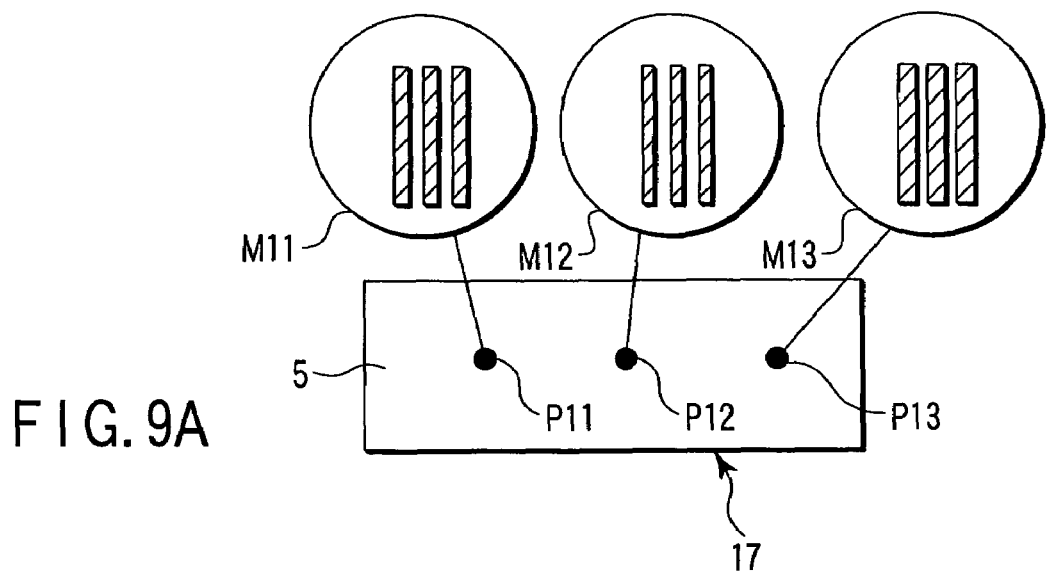
FIGS. 9A and 9B are a view and diagram showing a state in which a variation in the dimension of a plurality of L&S patterns on the photosensitive substrate corresponding to a plurality of L&S patterns of the same dimension and shape in a simultaneously exposed area even when a pupil transmission factor variation occurs by a method according to a second embodiment of the present invention.
Figure 9B:
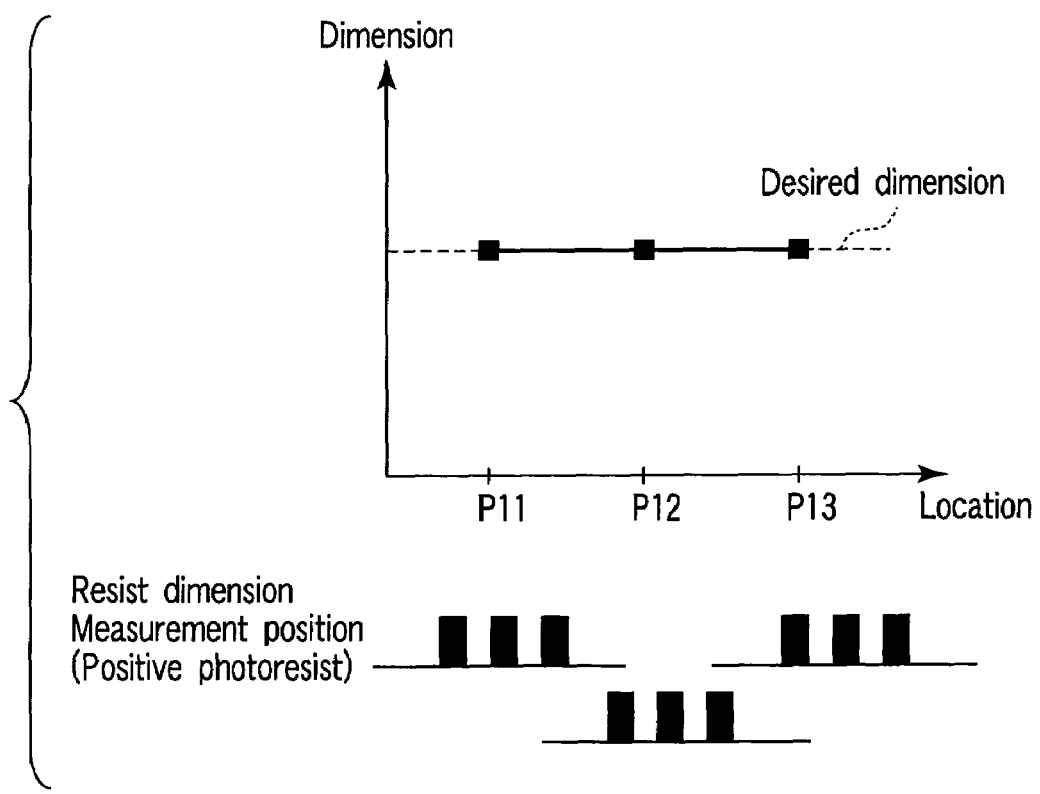

FIGS. 9A and 9B show a state in which a variation in the dimension as shown in FIGS. 8A and 8B is suppressed by adjusting the mask biases in the regions P12, P13 with respect to the region P11 set as a reference. In FIG. 8A, a reference symbol 17 denotes a simultaneously exposed area.

That is, in the region P12, the resist pattern dimension of the region on the photosensitive substrate 7 corresponding to the region P12 is reduced by applying mask bias used to reduce the width (line width) of the light shielding region to the designed dimension. Further, in the region P13, a variation in the dimension can be suppressed by increasing the resist pattern dimension of the region on the photosensitive substrate 7 corresponding to the region P13 by applying mask bias used to make large the width of the light shielding region to the designed dimension.

(Third Embodiment)

Figure 10:
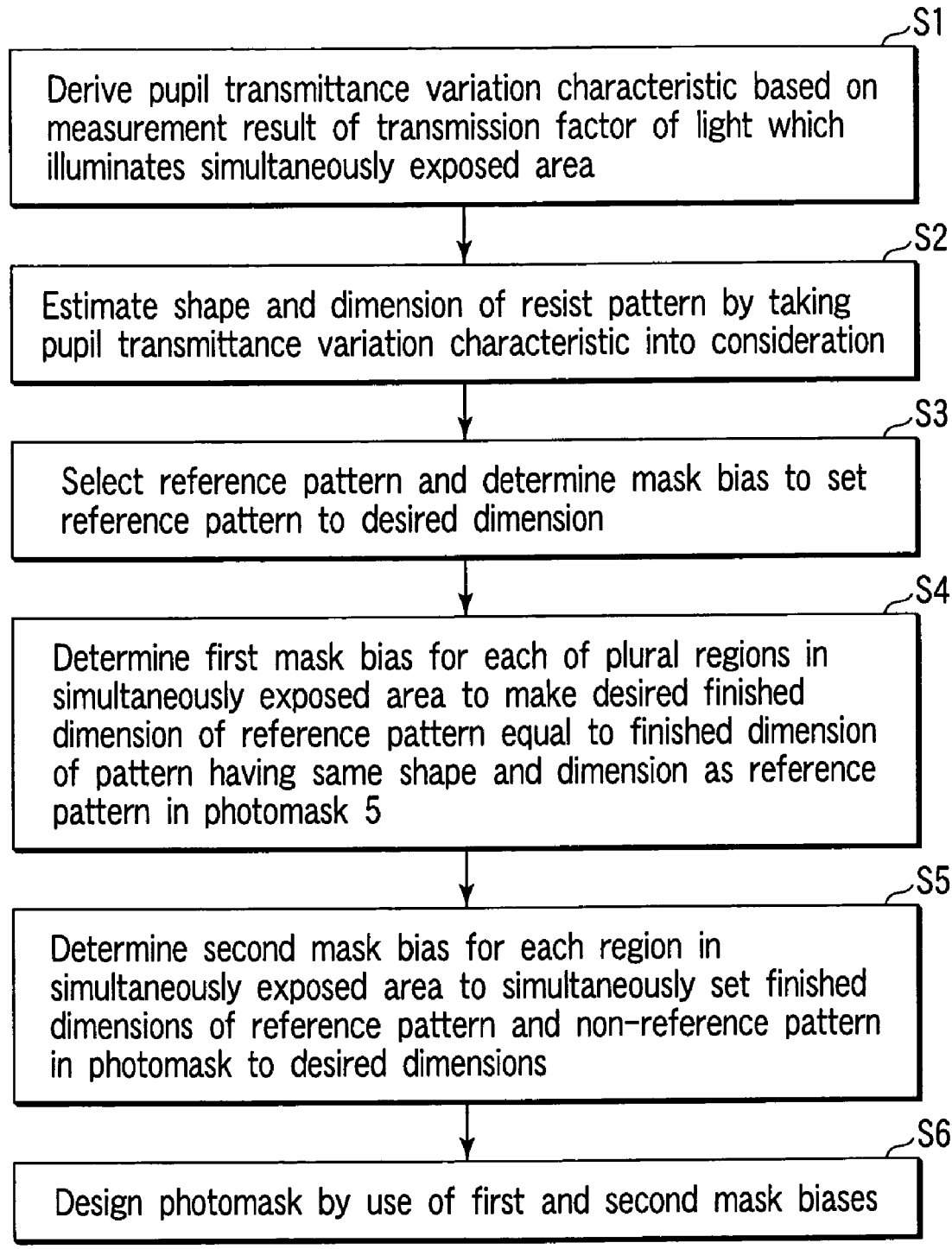
FIG. 10 is a flowchart for illustrating a photomask designing method according to a third embodiment of the present invention.

FIG. 10 is a flowchart for illustrating a photomask designing method according to a third embodiment of the present invention.

A method which simultaneously uses the method for suppressing the dimension variation in the simultaneously exposed area explained in the second embodiment and the method explained in the first embodiment, that is, the method for finishing the L&S patterns having the same shape and different dimensions to the desired dimensions at the same time can be carried out. The above method is explained as the photomask designing method of the present embodiment.

First, the transmission factors of light in the projection optical system 6 which reach a plurality of regions in the simultaneously exposed area are measured and the pupil transmittance variation characteristic of the projection optical system 6 is derived (step S1).

Next, the shape and dimension of the resist pattern are estimated by known simulation by taking the pupil transmittance variation characteristic acquired in step S1 into consideration (step S2).

Then, a pattern (reference pattern) used as a reference is selected and mask bias used to set the reference pattern to a desired dimension (designed dimension) is set (step S3).

The reference pattern may be selected from a photomask 5 actually used or may be set to a pattern (imaginary pattern) different from the pattern in the photomask 5 actually used.

Next, mask bias (first mask bias) is determined for each of a plurality of regions in the simultaneously exposed area so as to make the dimension of a pattern formed on the photosensitive substrate (finished dimension) corresponding to the reference pattern equal to the finished dimension corresponding to a pattern having the same shape and dimension as the reference pattern which exists in the simultaneously exposed area on the photomask 5 (step S4).

If the imaginary pattern is used as the reference pattern in step S3, the step S4 is carried out on the assumption that the imaginary pattern exists in the photomask 5 (this applies to the following steps).

Next, mask bias (second mask bias) of a non-reference pattern is determined for each region in the simultaneously exposed area so as to simultaneously set the finished dimensions of the reference pattern and the pattern (non-reference pattern) having a shape and dimension different from those of the reference pattern among the patterns in the photomask 5 to desired dimensions (step S5).

After this, the photomask 5 is designed by use of the first and second mask biases (step S6).

In a modification of the present embodiment, it is possible to provide a method for setting a region (reference region) which is used as a reference in the simultaneously exposed area in step S3 and determining mask biases for respective types of patterns to set desired patterns in the reference region to desired finished dimensions in step S4. Further, in the above method, it is possible to determine the mask biases for the respective types of patterns so as to suppress any variation in the finished dimensions of the patterns of the region other than the reference region in step S5.

In another modification, it is possible to provide a method for respectively deriving pupil transmission factor variations for a plurality of regions in the simultaneously exposed area, deriving the average value of the pupil transmission factor variations and deriving mask biases for respective types of patterns by use of the averaged pupil transmission factor variation. In this case, common mask bias is given to patterns of the same type (patterns of the same shape and dimension) in all of the regions in the simultaneously exposed area.

In the modification in which the common mask bias is used, an advantage that CAD data can be formed in a short period of time when the photomask 5 is formed can be attained although an influence by the pupil transmission factor variation may be slightly given to some regions. If a variation in the pupil transmittance variation characteristic in the simultaneously exposed area is small, a variation in the dimension of the resist pattern can be easily suppressed by using the above method.

(Fourth Embodiment)

Next, a fourth embodiment is explained. In the present embodiment, a method for predicting an optical image formed on a photosensitive substrate is explained.

Figure 11:
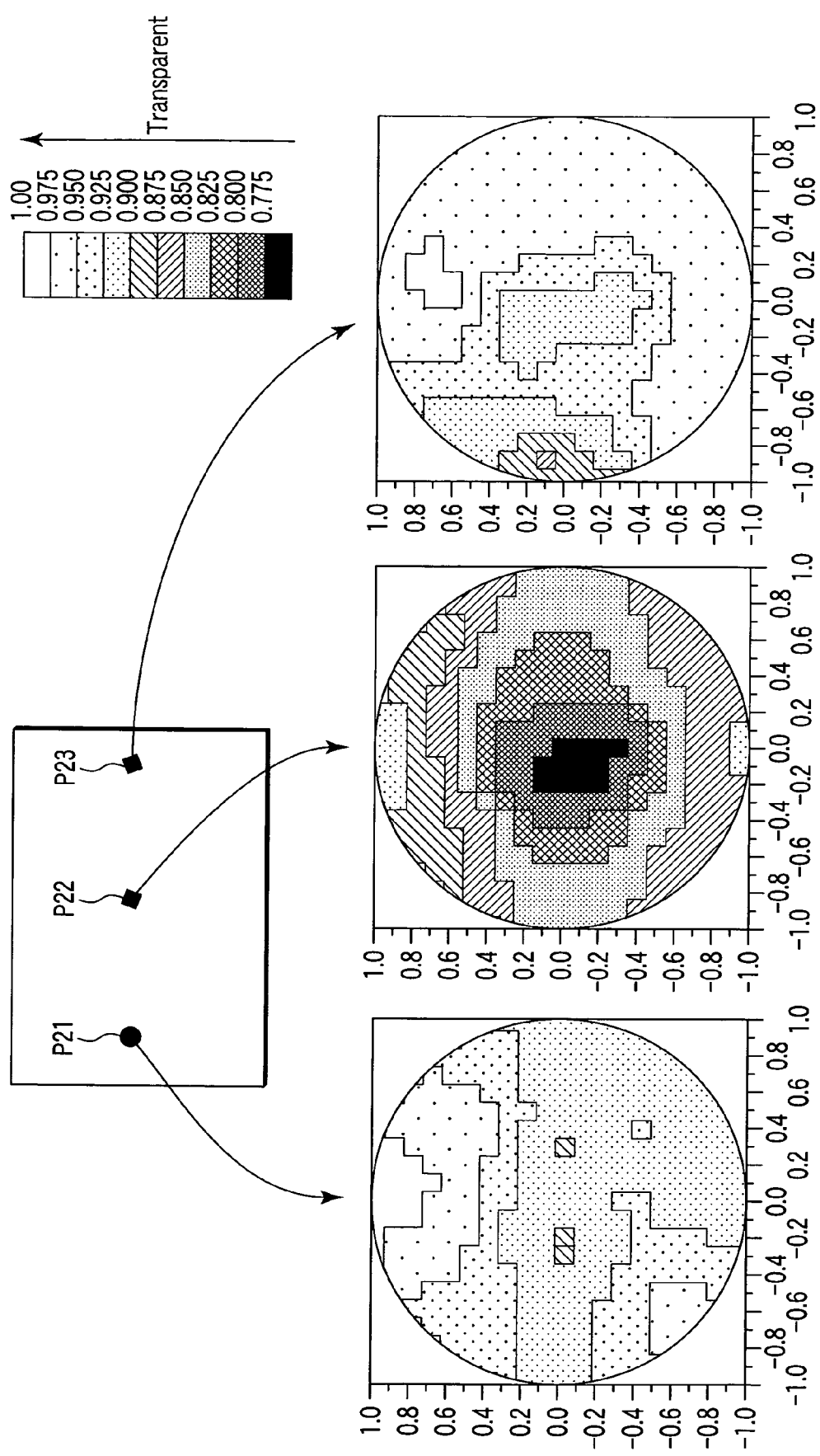
FIG. 11 is a diagram showing the measurement result of a pupil transmittance variation distribution of light which reaches a plurality of points in a simultaneously exposed area on a photomask.

First, the pupil transmittance variation distribution of a projection optical system 6 of the exposure device is measured. As the measuring method, a known method, for example, a method disclosed in Jpn. Pat. Appln. KOKAI Publication No. 2001-230179 is used. FIG. 11 shows the measurement result of the pupil transmittance variation distribution related to light which reach a plurality of regions P21 to P23 in the simultaneously exposed area on a photomask 5. The ordinate and abscissa are coordinate axes used to express the position on the pupil plane which is normalized by use of the radius of a circular diaphragm of the projection optical system 6.

Next, the measurement result is fitted to a series expressed by linear coupling of a Zernike polynomial defined by a pupil coordinate system ($\rho$-$\phi$ coordinate) of the projection optical system 6 so as to derive expansion coefficients. The Zernike polynomial is defined in a unit circle which expresses the pupil plane. In the Zernike polynomial, higher order items starting from the first item (constant item) express more complicated shapes. The first ($Z_1$) to sixth ($Z_6$) items of the Zernike polynomial are expressed as follows.

$$Z_1(\rho, \phi) = 1$$

$$Z_2(\rho, \phi) = \rho \cos \phi$$

$$Z_3(\rho, \phi) = \rho \sin \phi$$

$$Z_4(\rho, \phi) = 2\rho^2 - 1$$

$$Z_5(\rho, \phi) = \rho^2 \cos 2\phi$$

$$Z_6(\rho, \phi) = \rho^2 \sin 2\phi$$

A pupil transmission factor variation $T(\rho, \phi)$ at a desired point in the pupil is expressed by using the Zernike polynomial as indicated by the following equation.

$$T(\rho, \phi) = a_1 Z_1(\rho, \phi) + a_2 Z_2(\rho, \phi) + \cdots$$
$$= \sum_n a_n Z_n(\rho, \phi)$$

The sum related to "n" is adequately limited according to the required precision. In this case, an is an expansion coefficient and contains two parameter information items (X coordinate and Y coordinate of an optical image) relating to the optical image formed on the photosensitive substrate.

The expansion coefficient derived by fitting by use of the Zernike polynomial for one (point P21) of pupil transmittance variation data items expressed in FIG. 11 is so set that a2=0.0194, a3=−0.0054, a4=0.0040, a5=−0.0202, a6=0.0110, a7=−0.0019, a8=−0.0074 and a9=−0.0215.

When the pupil transmission factor variation is approximated by the linear coupling of the Zernike polynomial, calculation routines for the aberration and pupil transmission factor variation in a simulator can be commonly used since the expansion using the Zernike polynomial is used in dealing with the aberration. Therefore, the advantage that the simulator can be easily configured by approximating the pupil transmission factor variation by the linear coupling of the Zernike polynomial can be obtained.

Further, when the pupil transmittance variation distribution is expanded into a Zernike series, the respective terms have different influences on the optical image. Therefore, the advantage that the degrees of influence by the pupil transmission factor variation can be predicted to some extent based on the coefficients of the Zernike polynomial expansion by approximating the pupil transmission factor variation by the linear coupling of the Zernike polynomial can be obtained.

For example, the second item $Z_2$ expresses a distribution as shown in FIG. 12 and shows a state in which the transmission factor of the optical path on the left side of the pupil and the transmission factor of the optical path on the right side of the pupil are different. That is, the second item has an influence similar to that caused by so-called telecentricity deviation in which the position of an image is deviated depending on the focus value. Therefore, the influence by the telecentricity deviation can be predicted to some extent based on the second term.

Further, the fourth item $Z_4$ expresses a concentric-form distribution as shown in FIG. 13 and shows a state in which the transmission factor of the optical path is made different according to the distance from the center of the pupil. The distance of the diffraction light passage position from the center of the pupil is related to the repetition rate of the mask pattern. Therefore, the variation in the optimum exposure light amount depending on the repetition rate of the mask pattern can be predicted to some extent based on the fourth term.

The knowledge (in a physical sense) associated with the expansion coefficients of the Zernike polynomial as described above is effective in designing the mask pattern.

Next, expansion coefficients obtained by expanding the pupil transmittance variation distribution into the Zernike polynomial are fetched as input parameters and an optical image is predicted by computer simulation by taking the pupil transmission factor variation into consideration. The prediction is made by use of computer software (program). For this purpose, information on the expansion coefficients of the pupil transmission factor variation is previously held in the input file. The simulator (program) accesses the input file at the time of execution of the calculation and reads out numerical information in the input file.

An example of the input file is as follows.

| File Name: input.txt | |
|---|---|
| a1 | 1 |
| a2 | 0.0194 |
| a3 | −0.0054 |
| a4 | 0.0040 |
| a5 | −0.0202 |
| a6 | 0.0110 |
| a7 | −0.0019 |
| a8 | −0.0074 |
| a9 | −0.0215 |

The simulator (program) which reads out numerical information of the coefficients a1 to a9 from the input file calculates the pupil transmission factor variation $T(\rho, \phi)$ according to the equation (1) when a window function which will be described later is calculated (in step S14 in FIG. 15).

Figure 14:
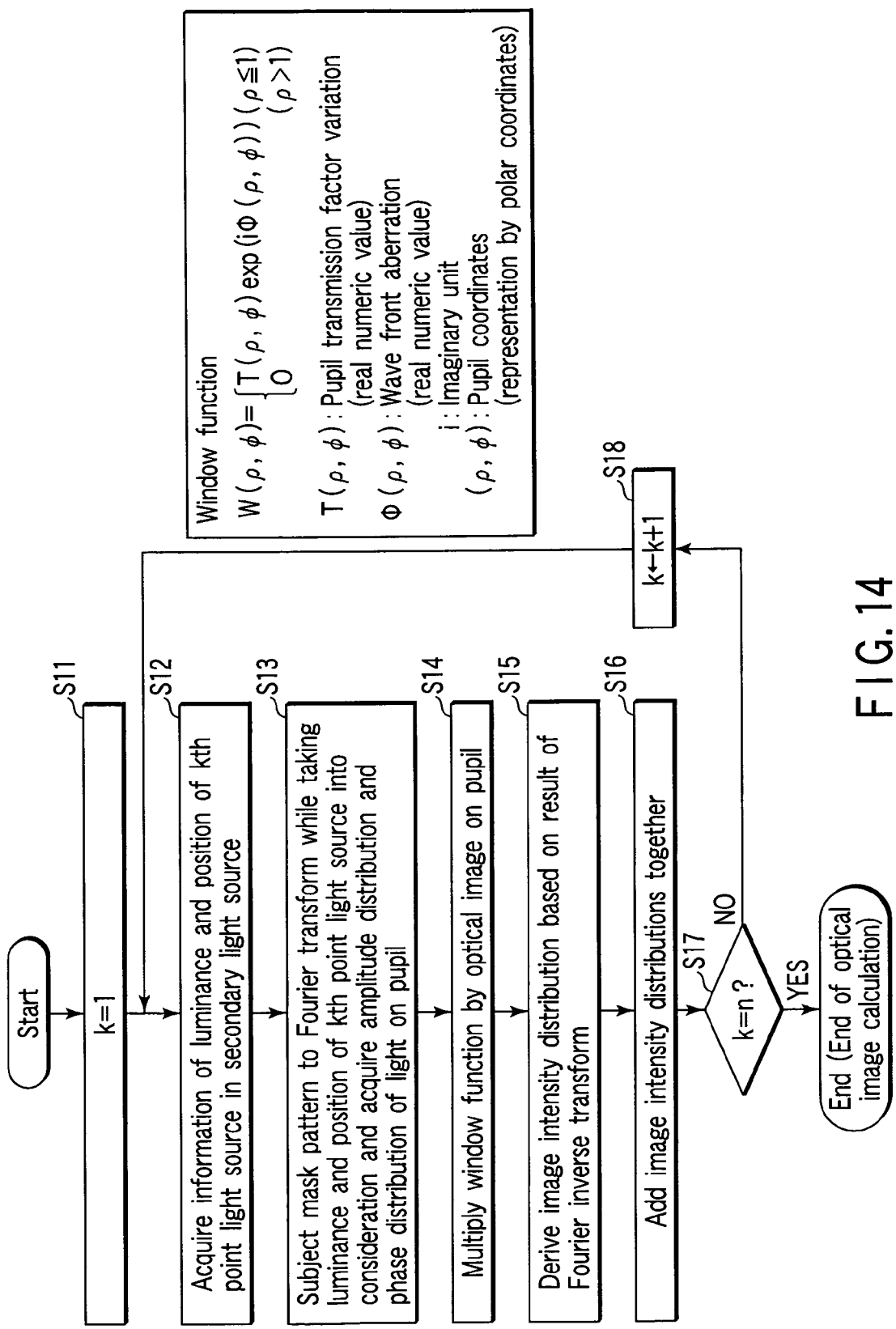
FIG. 14 is a flowchart for illustrating an optical image predicting method according to a fourth embodiment of the present invention.

FIG. 14 is a flowchart for illustrating a predicting method for the above optical image and shows one example of an algorithm of the simulator (program).

First, information associated with the luminance and the position of a desired first (k=1) point light source in a secondary light source is acquired (steps S11, S12). For example, the information is acquired by actual measurement or by calculation based on the specification value of the exposure device.

Next, a mask pattern fk(X, Y) is subjected to the Fourier transform (Fk($\rho, \phi$)) while taking the luminance and the position of the above point light source into consideration and the amplitude distribution and phase distribution of light on the pupil of the projection optical system 6 are acquired (step S13). In this case, $\phi$ and $\rho$ respectively indicate the angle and the length in the same-diameter direction which defines the polar coordinate on the pupil of the projection optical system 6.

Then, a window function $W(\rho, \phi)$ containing a pupil transmission factor function $A(\rho, \phi)$ having pupil coordinate dependency is multiplied by $F_k(A, \phi)$ derived in step S13 (step S14). The window function $W(\rho, \phi)$ is a function containing information of the aberration/pupil transmission factor variation and the size of the pupil of the projection optical system. The aberration (aberration data) is expressed by $\phi$ in the window function $W(\rho, \phi)$.

Next, the result ($F_k(\rho, \phi)$×window function) obtained in step S14 is subjected to the Fourier inverse transform. Further, an image intensity distribution of light on the photosensitive substrate formed by the above point light source is derived from the result of the Fourier inverse transform (step S15).

Then, the image intensity distribution obtained in step S15 and the total sum of the image intensity distributions formed by the first to (k−1)th light sources are added together (step S16). In the case of k=1 in step S12, it is assumed that the total sum of the image intensity distributions formed by the first to (k−1)th light sources is zero.

Then, the image intensity distributions formed by the n light sources in the secondary light source are added together by repeatedly performing the process of the step S12 to S16 (steps S17, S18) until k=1 is attained. Thus, an optical image on the photosensitive substrate 7 is calculated.

The process for adding the image intensity distributions together in step S16 can be collectively performed later. That is, the process of the step S12 to S15 is repeatedly performed to derive n image intensity distributions corresponding to k=1 to n in the secondary light source. Then, an optical image on the photosensitive substrate 7 can be obtained by adding the n image intensity distributions together.

In this example, an optical image is predicted, but a resist pattern can be predicted. As one example of a method for predicting the resist pattern, a known method for making a prediction based on convolution integral of the optical image calculated according to the flowchart of FIG. 14 and the exponential attenuation function containing a process factor, for example, the method described in the first embodiment (paragraph numbers 0020 to 0035) of Jpn. Pat. Appln. KOKAI Publication No. H8-148404 can be used.

Further, in this example, as the orthogonal polynomial used to approximate the transmission factor variation of the projection optical system, the Zernike polynomial is used. However, if the transmission factor variation can be approximated by use of a less number of expansion coefficients, another orthogonal polynomial can be used.

(Fifth Embodiment)

FIG. 15 is a flowchart for illustrating a mask pattern forming method according to a fifth embodiment of the present invention.

First, an aberration characteristic (lens aberration) of the exposure device and pupil transmittance variation characteristic are measured by a known method. Then, the aberration characteristic and pupil transmittance variation characteristic are expanded into Zernike polynomials based on measurement data of the aberration characteristic (lens aberration) and pupil transmittance variation characteristic to acquire expansion coefficients (step S21).

Next, data (mask pattern data) of a mask pattern designed on the assumption that none of the aberration and pupil transmission factor variation occur in the lens of the exposure device is formed (step S22).

Then, an optical image formed on the photosensitive substrate is predicted based on the mask pattern data, aberration data and pupil transmission factor variation data (step S23). For example, prediction of the optical image can be made by calculating the optical image according to the method of the fourth embodiment by use of the mask pattern data, aberration data and pupil transmission factor variation data.

After this, the optical image predicted in step S23 and the designed optical image formed on the photosensitive substrate are compared with each other (step S24).

As a result, if the difference between the two calculation results (the difference between the two optical images) lies outside the permissible range, pattern data is changed to reduce the difference for a pattern in the mask pattern. Thus, mask pattern data is newly formed (step S25).

Then, the process returns to step S23 and an optical image is calculated again and the process of steps S23 to S25 is repeatedly performed until the difference calculated in step S24 comes into the permissible range. If mask pattern data which causes the difference to come into the permissible range is derived, a photomask is manufactured by use of the mask pattern data (step S26). Further, when it is determined in step S24 that the difference between the optical images lies within the permissible range, the process proceeds to step S26.

As shown in FIG. 16, the prediction method of the fourth embodiment and the designing method of the fifth embodiment can be carried out by use of a computer program product 32 on which a program executed by a computer system 31 having a computer is recorded. The computer program product 32 is a disk such as a CD-ROM, DVD, for example.

In the case of a disk used to predict a pattern formed on the photosensitive substrate by illuminating light on the photomask and converging the light which has passed through the photomask on the photosensitive substrate via the projection optical system, the disk 32 is configured to store program instructions for execution on a computer system enabling the computer system 31 to perform a process for approximating a transmission factor variation of the projection optical system which varies depending on a difference in optical paths of the projection optical system for the light passing through the projection optical system by use of an orthogonal polynomial defined by pupil coordinates of the projection optical system, and predicting the pattern based on expansion coefficients of the orthogonal polynomial used to approximate the transmission factor variation of the projection optical system.

In the case of a disk used to design a photomask in a lithography process which includes illuminating light on the photomask, converging the light having passed through the photomask on a photosensitive substrate via a projection optical system and forming the pattern of the photomask on the photosensitive substrate, the disk 32 is configured to store program instructions for execution on a computer system enabling the computer system 31 to perform a process for designing a photomask, the photomask designing process comprising approximating a transmission factor variation of the projection optical system which varies depending on a difference in optical paths of the projection optical system for the light passing through the projection optical system by use of an orthogonal polynomial defined by pupil coordinates of the projection optical system, predicting a pattern formed by converging the light having passed through the photomask on the photosensitive substrate via the projection optical system based on expansion coefficients of the orthogonal polynomial used to approximate the transmission factor variation of the projection optical system, determining whether or not a difference between the predicted pattern and a designed pattern corresponding to the photomask lies within a preset range, and correcting the photomask to set the difference between the predicted pattern and the designed pattern into the preset range when the difference does not lie within the preset range.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A photomask designing method used in a lithography process, the lithography process comprising illuminating light on a photomask and converging the light which has passed through the photomask on a photosensitive substrate via a projection optical system, the designing method comprising:
    acquiring a transmittance characteristic of the projection optical system, the
        transmittance characteristic representing an attenuated amount of amplitude of light, the attenuated amount of the amplitude of the light varying, depending on a difference in optical paths of light in the projection optical system, and the light having passed through the projection optical system; and
    acquiring mask bias of the photomask by use of the transmittance characteristic of the projection optical system.

2. The designing method according to claim 1, wherein the acquiring the transmittance characteristic of the projection optical system comprises acquiring a transmission factor of the projection optical system for diffraction light which is generated on the photomask and passes through the projection optical system.

3. The designing method according to claim 1, wherein the photomask comprises a plurality of patterns having different shapes respectively and the acquiring the mask bias of the photomask comprises acquiring a plurality of mask biases for the plurality of patterns.

4. The designing method according to claim 2, wherein the photomask comprises a plurality of patterns having different shapes respectively and the acquiring the mask bias of the photomask comprises acquiring a plurality of mask biases for the plurality of patterns.

5. The designing method according to claim 1, wherein the acquiring the transmittance characteristic of the projection optical system comprises acquiring transmission factors of the projection optical system for diffraction lights which are generated on a plurality of regions of the photomask and the acquiring the mask bias of the photomask comprises respectively acquiring mask biases for the plurality of regions of the photomask.

6. The designing method according to claim 1, wherein the acquiring the transmittance characteristic of the projection optical system comprises acquiring transmission factors of the projection optical system for diffraction lights which are generated on a plurality of regions of the photomask and the acquiring the mask bias of the photomask comprises acquiring common mask bias for the plurality of regions of the photomask.

7. A pattern predicting method for predicting a pattern to be formed on a photosensitive substrate, the pattern being formed by illuminating light on a photomask and converging the light which has passed through the photomask on the photosensitive substrate via a projection optical system, the predicting method comprising:
    approximating a transmission factor variation of the projection optical system by use of an orthogonal polynomial defined by pupil coordinates of the projection optical system, the transmission factor variation representing variation of an attenuated amount of amplitude of light, the attenuated amount of the amplitude of the light varying, depending on a difference in optical paths of the light in the projection optical system, and the light having passed through the projection optical system; and
    predicting the pattern based on expansion coefficients of the orthogonal polynomial, the expansion coefficients approximating the transmission factor variation of the projection optical system.

8. The pattern predicting method according to claim 7, wherein the orthogonal polynomial is a Zernike polynomial.

9. The pattern predicting method according to claim 8, wherein the photosensitive substrate is a substrate on which a resist is coated and the pattern is an optical image of a pattern of the photomask projected on the resist or a resist pattern obtained by developing a resist on which an optical image of a pattern of the photomask is projected.

10. The pattern predicting method according to claim 7, wherein the photosensitive substrate is a substrate on which a resist is coated and the pattern is an optical image of a pattern of the photomask projected on the resist or a resist pattern obtained by developing a resist on which an optical image of a pattern of the photomask is projected.

11. A photomask designing method used in a lithography process, the lithography process comprising illuminating light on a photomask and converging the light which passes through the photomask on a photosensitive substrate via a projection optical system, the designing method comprising:
    approximating a transmission factor variation of the projection optical system by use of an orthogonal polynomial defined by pupil coordinates of the projection optical system, the transmission factor variation representing variation of an attenuated amount of amplitude of light, the attenuated amount of the amplitude of the light varying, depending on a difference in optical paths of light in the projection optical system, and the light having passed through the projection optical system;
    predicting a pattern formed by converging the light having passed through the photomask on the photosensitive substrate via the projection optical system based on expansion coefficients of the orthogonal polynomial, the expansion coefficients approximating the transmission factor variation of the projection optical system;
    determining whether a difference between the predicted pattern and a designed pattern corresponding to the photomask lies within a predetermined range or not; and
    correcting the photomask to set the difference between the predicted pattern and the designed pattern into the predetermined range when the difference does not lie within the preset range.

12. The designing method according to claim 11, wherein the orthogonal polynomial is a Zernike polynomial.

13. The designing method according to claim 12, wherein the photosensitive substrate is a substrate on which a resist is coated and the pattern is an optical image of a pattern of the photomask projected on the resist or a resist pattern obtained by developing a resist on which an optical image of a pattern of the photomask is projected.

14. The designing method according to claim 11, wherein the photosensitive substrate is a substrate on which a resist is coated and the pattern is an optical image of a pattern of the photomask projected on the resist or a resist pattern obtained by developing a resist on which an optical image of a pattern of the photomask is projected.

15. A computer program product configured to store program instructions for execution on a computer system enabling the computer system to perform a process for predicting a pattern to be formed on a photosensitive substrate, the pattern being formed by illuminating light on a photomask and converging the light which has passed through the photomask on the photosensitive substrate via a projection optical system, wherein the predicting the pattern comprising:

approximating a transmission factor variation of the projection optical system by use of an orthogonal polynomial defined by pupil coordinates of the projection optical system, the transmission factor variation representing variation of an attenuated amount of amplitude of light, the attenuated amount of the amplitude of the light varying, depending on a difference in optical paths of the light in the projection optical system, and the light having passed through the projection optical system; and predicting the pattern based on expansion coefficients of the orthogonal polynomial, the expansion coefficients approximating the transmission factor variation of the projection optical system.

16. The computer program product according to claim 15, wherein the orthogonal polynomial is a Zernike polynomial.

17. The computer program product according to claim 15, wherein the photosensitive substrate is a substrate on which a resist is coated and the pattern is a resist pattern obtained by developing a resist on which an optical image of a pattern of the photomask is projected or an optical image of a pattern of the photomask projected on the resist.

18. A computer program product configured to store program instructions for execution on a computer system enabling the computer system to perform a process for designing a photomask used for a lithography process, the lithography process including illuminating light on the photomask and converging the light having passed through the photomask via the projection optical system, wherein the designing the photomask comprising:

approximating a transmission factor variation of the projection optical system by pupil coordinates of the projection optical system, the transmission factor variation representing variation of an attenuated amount of amplitude of light, the attenuated amount of the amplitude of the light varying, depending on a difference in optical paths of the light in the projection optical system and the light having passed through the projection optical system;

predicting a pattern formed by converging the light having passed through the photomask on the photosensitive substrate via the projection optical system based on expansion coefficients of the orthogonal polynomial, the expansion coefficients approximating the transmission factor variation of the projection optical system;

determining whether a difference between the predicted pattern and a designed pattern corresponding to the photomask lies within a predetermined range or not; and correcting the photomask to set the difference between the predicted pattern and the designed pattern into the predetermined range when the difference does not lie within the preset range.

19. The computer program product according to claim 18, wherein the orthogonal polynomial is a Zernike polynomial.

20. The computer program product according to claim 18, wherein the photosensitive substrate is a substrate on which a resist is coated and the pattern is an optical image of a pattern of the photomask projected on the resist or a resist pattern obtained by developing a resist on which an optical image of a pattern of the photomask is projected.

* * * * *

UNITED STATES PATENT AND TRADEMARK OFFICE
CERTIFICATE OF CORRECTION

PATENT NO. : 7,139,998 B2 Page 1 of 1
APPLICATION NO. : 10/673427
DATED : November 21, 2006
INVENTOR(S) : Fukuhara et al.

It is certified that error appears in the above-identified patent and that said Letters Patent is hereby corrected as shown below:

Column 18, line 34, change "of light" to --of the light--.

Signed and Sealed this

Twenty-seventh Day of February, 2007

JON W. DUDAS
*Director of the United States Patent and Trademark Office*